United States Patent
Maijala et al.

(10) Patent No.: US 10,887,998 B2
(45) Date of Patent: Jan. 5, 2021

(54) METHOD AND AN ARRANGEMENT FOR PRODUCING ELECTRICALLY CONDUCTIVE PATTERNS ON SUBSTRATES

(71) Applicant: Stora Enso OYJ, Helsinki (FI)

(72) Inventors: Juha Maijala, Espoo (FI); Petri Sirviö, Imatra (FI)

(73) Assignee: Stora Enso OYJ, Helsinki (FI)

( * ) Notice: Subject to any disclaimer, the term of this patent is extended or adjusted under 35 U.S.C. 154(b) by 59 days.

(21) Appl. No.: 15/576,340

(22) PCT Filed: May 23, 2016

(86) PCT No.: PCT/IB2016/053004
§ 371 (c)(1),
(2) Date: Nov. 22, 2017

(87) PCT Pub. No.: WO2016/189446
PCT Pub. Date: Dec. 1, 2016

(65) Prior Publication Data
US 2018/0168048 A1 Jun. 14, 2018

(30) Foreign Application Priority Data
May 26, 2015 (SE) ........................................ 1550675

(51) Int. Cl.
*H05K 3/12* (2006.01)
*H05K 3/10* (2006.01)
(Continued)

(52) U.S. Cl.
CPC ........... *H05K 3/1275* (2013.01); *H05K 3/102* (2013.01); *H05K 3/32* (2013.01); *H05K 3/4007* (2013.01);
(Continued)

(58) Field of Classification Search
CPC .................................................. H05K 3/1275
See application file for complete search history.

(56) References Cited

U.S. PATENT DOCUMENTS

| 5,114,744 A | 5/1992 | Cloutier et al. |
| 8,919,468 B2 | 12/2014 | Ono et al. |

(Continued)

FOREIGN PATENT DOCUMENTS

| EA | 8748 B1 | 8/2007 |
| EP | 1993132 A2 | 11/2008 |

(Continued)

OTHER PUBLICATIONS

International Searching Authority, International Search Report, PCT/IB2016/053004, dated Aug. 18, 2016.
(Continued)

*Primary Examiner* — Austin Murata
(74) *Attorney, Agent, or Firm* — Greer, Burns & Crain, Ltd.

(57) ABSTRACT

A method (200, 300, 500) for producing an electrically conductive pattern on substrate (202, 402), comprising: providing electrically conductive solid particles onto an area of the substrate in a predefined pattern (508), where the pattern (403) comprises a contact area (404B) for connecting to an electronic component and a conductive structure (404A) having at least a portion (414) adjacent to the contact area, heating the conductive particles to a temperature higher than a characteristic melting point of the particles to establish a melt (510), and pressing the melt against the substrate in a nip, the temperature of the contact portion of which being lower than the aforesaid characteristic melting point so as to solidify the particles into essentially electrically continuous layer within the contact area and within the conductive structure in accordance with the pattern (512), wherein the thermal masses of the contact area and the at (Continued)

least adjacent portion of the conductive structure are configured substantially equal.

13 Claims, 4 Drawing Sheets

(51) Int. Cl.
*H05K 3/40* (2006.01)
*H05K 3/32* (2006.01)
*H05K 1/09* (2006.01)

(52) U.S. Cl.
CPC ............ *H05K 1/092* (2013.01); *H05K 3/1283* (2013.01); *H05K 2203/1131* (2013.01); *H05K 2203/1545* (2013.01)

(56) References Cited

U.S. PATENT DOCUMENTS

| | | |
|---|---|---|
| 2010/0104741 A1 | 4/2010 | Vontell et al. |
| 2010/0159373 A1 | 6/2010 | Tombs et al. |
| 2011/0079877 A1* | 4/2011 | Kawashima ...... H01L 23/49838 257/532 |
| 2015/0017341 A1* | 1/2015 | Sirvio ...................... B05D 3/12 427/469 |
| 2016/0056544 A1* | 2/2016 | Garcia ................... H01Q 23/00 343/725 |

FOREIGN PATENT DOCUMENTS

| | | |
|---|---|---|
| JP | 2014113830 A | 6/2014 |
| RU | 2468550 C1 | 11/2012 |
| WO | 2008006941 | 1/2008 |
| WO | 2009135985 | 11/2009 |
| WO | 20090143206 A1 | 11/2009 |
| WO | 2013113995 | 8/2013 |
| WO | WO 2013/113995 * | 8/2013 |

OTHER PUBLICATIONS

International Searching Authority, Written Opinion of the Internation Searching Authority, PCT/IB2016/053004, dated Aug. 18, 2016.

Hiroyuki Yzuriha, Japanese Office Action, Application No. 2017-561296, dated Jan. 26, 2020.

* cited by examiner

PRIOR ART

METHOD AND AN ARRANGEMENT FOR PRODUCING ELECTRICALLY CONDUCTIVE PATTERNS ON SUBSTRATES

This application is a U.S. National Phase under 35 U.S.C. § 371 of International Application No. PCT/IB2016/053004, filed May 23, 2016, which claims priority under 35 U.S.C. §§ 119 and 365 to Swedish Application No. 1550675-1, filed May 26, 2015.

FIELD OF THE INVENTION

Generally the present invention relates to manufacturing of an electrically conductive pattern. The invention pertains to a method and an arrangement for establishing the pattern from conductive particles attached to a target substrate according to the pattern.

BACKGROUND

Printed electronics enables cost-effective integration of electronic functionality to a large variety of consumer products. Here it should be noted that even if a traditional, epoxy- or polyester based circuit board is often referred to as a printed circuit board (PCB), it does not fulfil the actual definition of printed electronics. In a PCB the use of (silk screen) printing is limited to producing the etch-resistant ink patterns prior to the etching of undesired copper, as well as to producing visible markings on the surface of an otherwise completed board. True printed electronics mean that conductive, semiconductive, and/or possibly other patterns that constitute actual functional elements of the electronic circuit are additively formed on a substrate in a printing process such as screen, gravure or ink jet printing among other options.

Although not mandatory, it is typically advantageous if the process used to produce printed electronics is of the so-called roll-to-roll type, meaning that the substrate may come in the form of a long, rolled web, which is unwound for the printing step and can be again wound to a roll thereafter. Another widely used feeding mechanism is sheet feeding, in which the substrate comes in the form of a large number of sheets that are fed through the printing process.

One key question of producing printed electronics is how to ensure that conductive material is only distributed and attached to the desired portions of the substrate and that the material exhibits the necessary conductive also after the attaching phase. A published PCT application with publication number WO2013113995 discloses a method for producing an electrically conductive pattern on a surface, wherein electrically conductive solid particles are provided onto an area of predetermined form on a surface of the substrate, heated and pressed against it to bond and solidify the practically melted particles so that a continuous, electrically conductive layer is formed.

Notwithstanding the various benefits many recent solutions such as the one of '995 have over more traditional methods of producing conductive patterns on surfaces, the room for improvement is still substantial. For example, in use scenarios involving manufacturing of multiple finer resolution, closely-located conductive structures the present techniques have often turned out inferior due to partially uncontrollable and unpredictable spreading of conductive material upon melting, bonding and solidification, as well as other problematic issues such as cracking of conductive material layers weakening or completely preventing the desired electrical connections. Accordingly, the resulting solidified structures have contained defects such as deformation and short-circuiting of adjacent conductors, and on the other hand, also electrical contact-weakening or -destroying cracks in the conductive traces, which often render the associated product completely useless.

Figure 1:
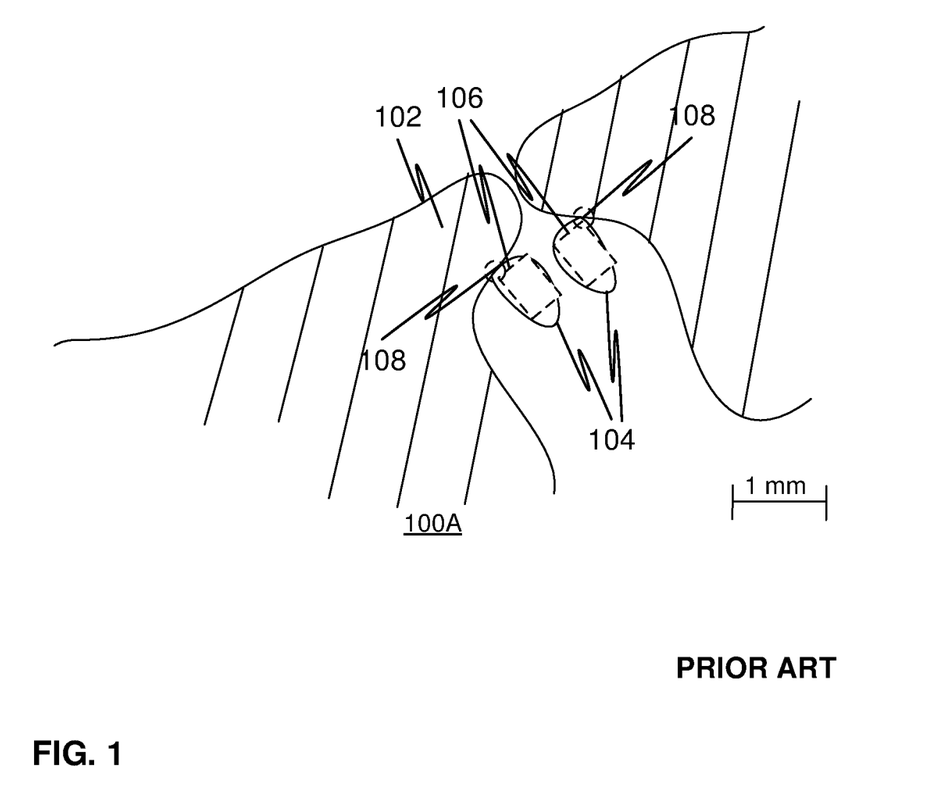
FIG. 1 depicts one example of a conductive pattern provided on a substrate in accordance of a prior art method.

FIG. 1 illustrates one prior art scenario in which rectangular, conductive contact areas 104 and neighboring conductive elements 102 have been manufactured by providing conductive particles onto the substrate such that the contact areas 104 and elements 102 are formed, which includes heating and pressing the particles to bond them together through melting and solidification. During the process, the general layout of particles has slightly changed from the intended original one (notice e.g. the rectangles 106 indicative of desired contact area shapes in contrast to the actually resulting contact area shapes 104), whereupon at the circled locations 108, the contact areas 104 and conductive elements 102 have been brought into direct contact with each other. A person skilled in the art will easily realize that the occurred short-circuiting of conductive areas that ought to remain separate usually completely ruins the usability of the product and spoils the yield having regard to the manufacturing process in question.

SUMMARY OF THE INVENTION

The objective is to provide an improved solution for establishing conductive patterns on a substrate, which at least alleviates one or more of the aforesaid challenges of the existing solutions.

The objective may be met with embodiments of a method and related arrangement in accordance with the present invention.

Accordingly, in one aspect a method for producing an electrically conductive pattern on a substrate, which may be substantially non-conductive or have at least substantially non-conductive surface, comprising:

providing electrically conductive solid particles onto an area of the substrate in a predefined pattern, where the pattern comprises a contact area for connecting to an electronic component and a conductive structure, such as another contact area, conductor and/or antenna element, having at least a portion adjacent to the contact area, heating the conductive particles to a temperature higher than a characteristic melting point of the particles to establish a melt, and pressing the melt against the substrate in a nip, the temperature of the contact portion of which being lower than the aforesaid characteristic melting point so as to solidify the particles into essentially electrically continuous layer within the contact area and within the conductive structure in accordance with the pattern, wherein the thermal masses of the contact area and the at least adjacent portion of the conductive structure are configured substantially equal.

In one embodiment, said configuring comprises providing the electrically conductive particles onto the substrate in substantially similar volumes for the contact area and for the at least portion of the conductive structure.

Therefore, the sizes of the surface areas and related layer thicknesses are preferably substantially similar for both the contact area and the at least portion of the conductive structure.

Optionally, besides the sizes of the surface areas, also the shapes and dimensions of the contact area and the at least portion of the conductive structure are substantially matched.

Further, same types of particles, e.g. essentially the same powder of conductive particles, are preferably used for establishing both the contact area and the at least adjacent portion of the conductive structure, optionally for establishing the whole pattern.

Alternatively, mutually different volumes of mutually different conductive solid particles may be utilized for establishing the contact area and the at least adjacent portion of the conductive surface. However, the volumes as defined by the sizes of the associated surface areas and material layer thicknesses shall still be configured and the used materials selected such that the thermal masses of the contact area and of the at least adjacent portion of the conductive surface are about the same.

In another aspect, an arrangement for producing an electrically conductive pattern on a substrate comprises:

a particle handler configured to transfer electrically conductive solid particles onto an area of the substrate to establish a predefined pattern, where the pattern comprises a contact area for connecting to electronic component and a conductive structure, such as another contact area, conductor and/or antenna element, having at least a portion adjacent to the contact area, the particles being disposed on the substrate such that the thermal masses of the contact area and the at least adjacent portion of the conductive structure are substantially equal, a heater configured to heat the conductive particles to a temperature higher than a characteristic melting point of the particles to establish a melt, and a temperature controlled nip configured to press the melt against the substrate, the temperature of the contact portion of which being lower than said characteristic melting point so as to solidify the particles into essentially electrically continuous layer within the contact area and within the conductive structure in accordance with the pattern.

Different considerations concerning the various embodiments of the method may be flexibly applied to the embodiments of the arrangement mutatis mutandis and vice versa, as being appreciated by a skilled person.

The utility of the present invention is based on multiple factors depending on the embodiment. The suggested solution enables, responsive to the introduced thermal mass matching, implementing controlled heat transfer and heat management during the heating, melting, and solidification activities of the provided manufacturing method of conductive patterns and generally electronic devices such as wireless tags. Both convenient and efficient techniques of roll-to-roll processes and printed electronics may be utilized.

In view of the applied thermal management scheme including heating temperature for the conductive materials and the associated volumes that can be estimated via related surface areas when the same material and layer thickness are used for all concerned volumes, the temperatures of the contact area and neighboring conductive structure may be equalized and optimized so that neither of them heats too much or too little, or heats up or cools down too fast or slowly.

Indeed, electrically conductive paths in desired portions of the established circuit layout may be reliably obtained while undesired phenomena such as connection-deteriorating cracks may be avoided in conductive elements. Further, uncontrolled spreading and smearing of melted conductive material and related short-circuits may be reduced. Yet, an improved aesthetic design closer to a target appearance may be ultimately obtained as the unpredictable irregularities in the finally achieved circuit pattern arising from the variance in the material flow and other properties are lessened.

Thus, the desired kinds of conductive patterns may be generally achieved on the target substrates with good accuracy, resolution and without major artefacts, which provides for improved industrial yield.

The expression "a number of" may herein refer to any positive integer starting from one (1).

The expression "a plurality of" may refer to any positive integer starting from two (2), respectively.

The terms "a" and "an" do not denote a limitation of quantity, but denote the presence of at least one of the referenced item.

The terms "first" and "second" do not denote any order, quantity, or importance, but rather are used to distinguish one element from another.

The term "thermal mass" refers herein to a heat absorption, storing and releasing property regarding a piece, layer or volume of material, and may be indicated via the mass of the material in that piece, layer, or volume and the specific heat capacity of the material through multiplication of the two, for instance.

BRIEF DESCRIPTION OF THE DRAWINGS

Next the present invention will be described in greater detail with reference to the accompanying drawings, in which.

DETAILED DESCRIPTION

FIG. 1 was already reviewed hereinbefore in conjunction with the description of prior art.

Figure 2:
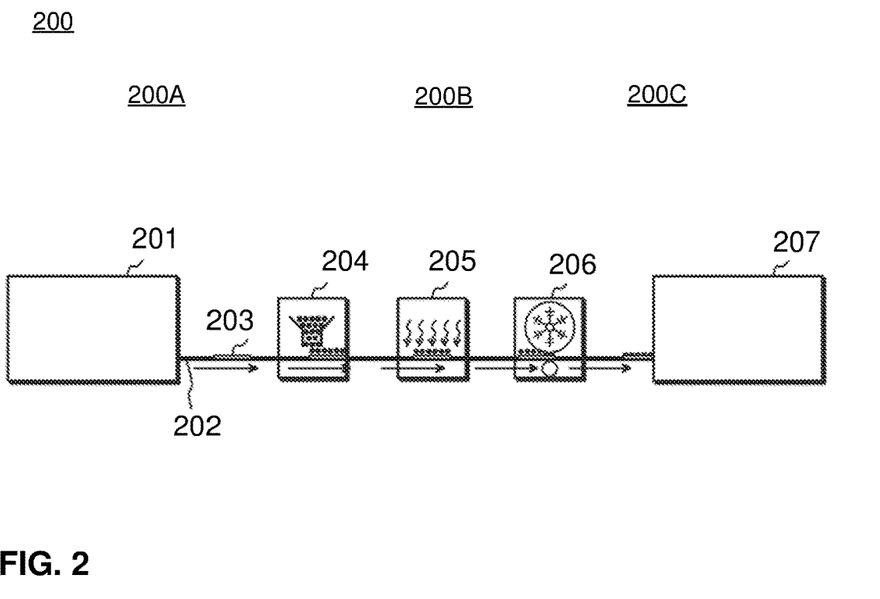
FIG. 2 illustrates a method and an arrangement according to an embodiment of the present invention.

FIG. 2 illustrates, at 200, one embodiment of a present invention having regard to both a method and an apparatus. A substrate handler mechanism comprises a substrate feeder 201, which can be, for example, an unwinding station where a fibrous web is unwound from a roll, or a stack handler where sheets or corresponding planar substrate pieces are taken from a stack. The substrate is generally designated with the reference numeral 202, and it can be of any of a wide variety of materials, shapes and thicknesses. Paper, board and polymer films (plastics) have been considered good substrates, but other similar non-conductive surfaces may be also used. As such, paper, board or other substrate can be coated, uncoated, wood-free or wood-containing. Multi-layer substrates are also usable, in which case the substrate does not need to be thoroughly non-conductive; it is sufficient if the surface onto which the conductive patterns will be printed is non-conductive. Other possible substrates include for example textiles, non-woven materials, circuit boards of electronics industry, moulded articles, and glass. Further possibilities involve construction materials, such as wallpapers and floor coatings, unfired and fired ceramics, (bio)polymer bases and composites. Each one of the listed substrates has its own application areas and advantages.

Instead of continuous, e.g. roll-to-roll processing capable substrates that may be optionally cut to smaller product pieces afterwards, sheet type or piece at a time type manufacturing could be applied in a step-like fashion omitting the continuous or continuously moving aspect of the illustrated solution.

Further, the substrate feeder 201 may comprise means for creating an adhesion area 203 on the surface of the substrate 202. For the purposes of the present invention is not essential to create an adhesion area, but it may help in simplifying the next step in the process. An adhesion area is characterised in that adhesion of electrically conductive solid particles (which will be transferred onto the surface of the substrate in the next step) to the substrate is stronger within the adhesion area than outside it. For the purposes of the present invention, different mechanism(s) for attaining the necessary adhesion may be utilized depending on the embodiment. For instance, dispersive adhesion (i.e. glueing) or electrostatic adhesion are applicable options.

As an example of the former, the substrate feeder 201 may comprise an adhesive printing or lacquering section (not separately shown) that is configured to spread an adhesive or lacquer onto the substrate to create an adhesion area of predetermined form, such as the form of the conductive pattern relied to be established thereon. If electrostatic adhesion is relied upon, the substrate feeder 201 may comprise an electric charger section that is configured to create a spatial distribution of static electric charge in the substrate (or on the substrate surface) to create an adhesion area of predetermined form. In some cases it may be desirable to make the adhesion area 203 cover the whole surface of the substrate, either because the whole surface is to be covered with a conductive pattern or because the form and size of the conductive pattern will be determined by selectively transferring electrically conductive solid particles to only a part of the adhesion area. Therefore we may conclude that a limiting case of the concept "predetermined form" is actually the form of the whole substrate.

The process step that is illustrated as taking place in section 204 involves transferring electrically conductive solid particles onto the substrate 202. Consequently the part of the apparatus responsive for the operation in section 204 may be called a particle handler. The electrically conductive solid particles may be selectively applied only to the adhesion areas that were created within the substrate feeder 201.

The conductive solid particles are arranged in a predefined conductive pattern on the substrate 202. The adhesion area may conform to the pattern shape so that the particles are attached to the areas of the desired pattern only.

The pattern may include a number of, or a plurality of, elements and related volumes (areas with thicknesses) that are physically separate from each other on the substrate 202. Preferably, the pattern comprises a number of first elements that advantageously define a number of conductive contact areas, or 'contact pads', for connecting to an electronic component to be disposed thereon. Further preferably, the pattern comprises a number of second elements that advantageously define a number of conductive structures such as one or more antennae or other functional structures.

Various elements of the pattern that are to remain physically separate from each other but still adjacent to each other on the substrate shall be designed such that during the provision, melting and solidification of the related conductive particles and of potential other constituent materials of the elements the material flow to undesired areas between the elements stays practically non-existent or at least minimal to avoid creating short-cuts, cracks, or reducing the visual appeal of the product due to smearing or dripping of melted materials. The proper design covers various aspects such as the used materials including conductive particles, as well as the shapes, dimensions and the mutual positioning of the elements. Many of such aspects converge at the general concept of heat management during the manufacturing process. Thermal masses of adjacent elements may be optimized such that the heat is distributed optimally among them. In most cases, the thermal masses should be designed substantially similar if not practically the same. Thermal mass depends on the heat capacity and actual mass of the element in question, and is thus strongly affected by the surface area and thickness of the associated material layer. Yet, the mutual similarity of the shapes and dimensions of the elements may be often considered a benefit as accordingly, the thermal mass of the elements is also spatially equalized. These issues are discussed in more detail with reference to FIG. 4.

The aforementioned electronic component may be or include an integrated circuit or other active component such as a transistor, diode, LED (light-emitting diode), etc., or a passive component such as a resistor, capacitor, or a coil. The component may be surface-mountable and comprise a predefined type of packaging, optionally of flip-chip type.

Reverting to FIG. 2, it is also possible to transfer electrically conductive solid particles onto the surface of the substrate with a method that involves substantially simultaneously creating the necessary adhesion. For example, the electrically conductive solid particles may come as a part of a compound that contains, in addition to the electrically conductive solid particles, a fluid or gelatinous substance that has adhesive properties. That could make the preparatory creation of adhesion areas 203 unnecessary at any step that precedes section 204; on the other hand leaving out the preparatory creation of adhesion areas may impose stricter requirements to the operating accuracy of the particle handler, if it should alone ensure that only the desired, predetermined areas of the surface of the substrate will be covered with the electrically conductive solid particles.

The section schematically illustrated as 205 comprises heating the electrically conductive solid particles to a temperature that is higher than a characteristic melting point of the electrically conductive solid particles. Using a heater configured to apply a non-contacting heating method involves the advantageous characteristic that the heating will not easily cause smearing or unwanted macroscopic changes in the spatial distribution of conductive material on the surface of the substrate. In other words, the electrically conductive matter stays in place where it was meant to be. However, the invention does not specifically exclude heating methods that are contacting. Especially if a contacting heating method involves the use of a very low contact pressure, it may well have the same advantageous non-smearing characteristics. As a result of the heating, a melt is created.

The section illustrated as 206 is the so-called cold nip, where the designator "cold" must be understood to mean "relatively cold" compared to the heating section that precedes it. In the cold nip, the melt that was created by heating in section 205 is pressed against the substrate 202. Because the invention allows (but does not require) using an adhesive agent on the surface of the substrate to create the adhesion area 203, pressing the melt against the substrate conceptually covers both pressing a melt directly against a substrate and pressing a melt against an adhesive layer that is located on the surface of the substrate between the melt and the substrate.

A surface temperature of a portion of the cold nip that comes against the melt is lower than the characteristic melting point that was discussed above. Thus the cold nip will cause the previously melted material of the originally solid electrically conductive particles to solidify again, but this time not in the form of separate particles but in the form of an essentially continuous, electrically conductive layer that covers that area on the surface of the substrate onto which the electrically conductive solid particles were transferred in the particle handler 204.

It has been found advantageous to maintain the effective temperature (i.e. the surface temperature of that portion of the cold nip that comes against the melt) in the cold nip only little lower than said characteristic melting point. This ensures for example that the melt will not solidify prematurely, before it would become pressed against the substrate. It also ensures that the solidification will take place sufficiently slowly, so that under the nip pressure the melt will still have some time to flow and form the essentially continuous layer of electric conductivity that is aimed at, as well as to flow into eventual pores or voids in the substrate surface, which enhances adhesion.

On the other hand, using a cold nip (and not a hot one that would aim to maintain the melted state of the melt) involves the advantage that despite the nip pressure, the edges of the desired conductive pattern will largely maintain their location and size. In other words, the melted conductive material will not gush across the surface of the substrate to fill, stain, or drip to areas of the surface that were meant to remain non-conductive.

According to an embodiment of the invention, the difference between the cold nip temperature and the characteristic melting point is not more than about 50-60 degrees centigrade, i.e. the surface temperature of the portion of the nip that comes against the melt is not lower than 60 degrees centigrade below the characteristic melting point. In many cases an even much smaller difference in temperature can be used. It has been found that the optimal difference between the cold nip temperature and the characteristic melting point is—at least to some extent—a function of the speed at which the substrate is driven through the process. In one test arrangement the substrate was driven at 6 metres per minute, and the temperatures were between 175 and 177 degrees centigrade, ends included, for the characteristic melting point and 142 degrees centigrade for the cold nip. When everything else was kept the same but the driving speed was increased to 10 metres per minute, it was found that the optimal cold nip temperature was 151 degrees centigrade. In said test arrangement the general conclusion was that at driving speeds varying between 5 and 10 metres per minute, the cold nip temperature should be selected in the range from 135 to 155 degrees centigrade, ends included, with faster driving speeds corresponding to higher cold nip temperatures.

It should be noted that when the metal alloy that was used in said test arrangement is heated, it begins to soften at 135 degrees centigrade already but melts fully only at 177 degrees centigrade (hence the somewhat flexible value for the characteristic melting point used in the example above). It is typical to non-eutectic metal alloys that they have the so-called solidus and liquidus temperatures, between which they exist as a paste of solid particles in a melt of the lower-melting phase. For some non-eutectic alloys it may be better to consider the liquidus temperature as the characteristic melting point, because above the liquidus temperature it is certain that the substance in question behaves predominantly as a fluid. For some other non-eutectic alloys, however, the behaviour of the substance between its solidus and liquidus temperatures is so fluid-like (e.g. when the alloy of two metals only contains a relatively small amount of the hotter-melting metal) that it may be justified to consider the solidus temperature (or e.g. some other temperature between the solidus and liquidus temperatures) as the characteristic melting point.

Non-eutectic alloys have in general been found to suit the purposes of the present invention very well, even better than eutectic ones or pure metals that have a well-defined single temperature as their melting point. This is particularly true for non-eutectic alloys of the kind mentioned above, that begin to behave fluid-like already below their liquidus temperature. The partially melted alloy may behave like a porridge or a relatively viscous fluid, which makes its movements on the surface of the substrate foreseeable and easy to control. Additionally the temperature range between the solidus and liquidus temperatures allows for some tolerances in controlling the temperatures of the various parts of the apparatus. To the contrary, an eutectic alloy or a pure metal may exhibit a very sharp transition between a completely solid state and a liquid state of very low viscosity, which makes it prone to difficulties in keeping the correct temperatures and controlling the flow of the conductive material at and after heating. Saying that the produced conductive patterns are essentially continuous means that they need to be continuous only to the extent that throughout each pattern they offer the desired cross section of conductive substance, so that electric resistance does not becomes prohibitively high. Another factor that defines the required continuity (and accuracy in location) is the size of contact pads in components that will be attached to the printed conductive patterns, as well as the accuracy at which such attaching will be performed. It is easy to understand that if the typical size of contact pads is in the order of magnitude of a square millimetre, individual pores in the corresponding printed conductive pattern may be quite acceptable if they are smaller than that, for example in the order of a few hundred micrometres or smaller.

In some embodiments of the invention it may even be advantageous to keep the so-called cold nip temperature equal or almost equal to the characteristic melting point of the used electrically conductive material. Even if that may mean that the actual solidifying of the material takes place only immediately after the cold nip and not in the cold nip itself, the pressure applied with the rollers of the cold nip may still have very advantageous effects in terms of e.g. adhesion and surface smoothness.

The substrate handler mechanism that is schematically illustrated in FIG. 2 comprises a substrate collector 207, in which the substrate with the completed conductive patterns on its surface is collected. The substrate collector 207 may comprise for example a winder station or a stacker, in which a continuous-web like substrate is wound into a roll or the pieces of a sheet-like substrate are stacked respectively. The substrate collector 207 may comprise also postprocessing means that are configured to postprocess the substrate after forming the conductive patterns, for example by cooling, removing static electric charge, coating, evaporation of volatile components of substances present within or on the substrate, or the like.

Alternatively or additionally, a number of electronic components such as ICs, other active components, or passive components may be provided to the substrate within element 207.

Figure 3:
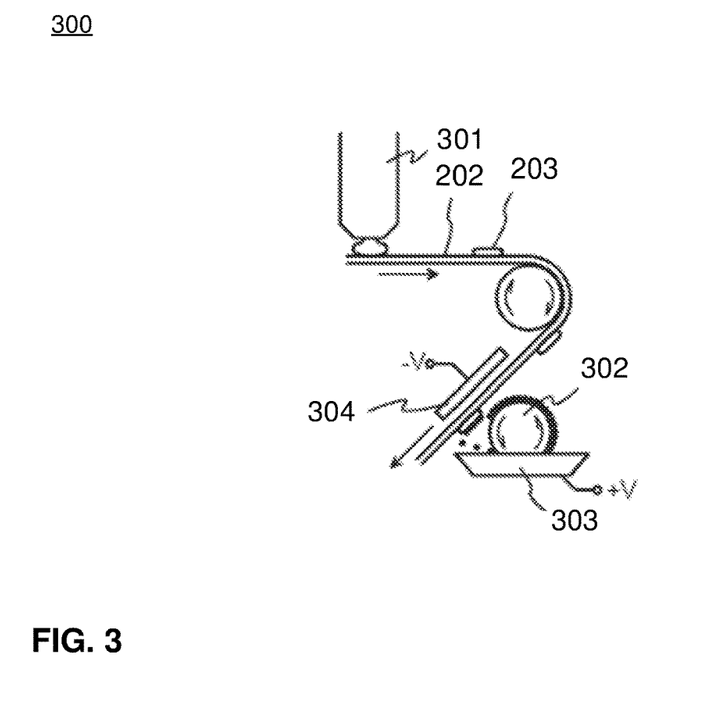
FIG. 3 illustrates transferring electrically conductive solid particles on a substrate according to one feasible option.

FIG. 3 illustrates an embodiment of the invention where the adhesion areas 203 are created by spreading adhesive onto the substrate 202 with an adhesive applicator 301. A very wide variety of methods have been known for a very long time to apply an adhesive onto the surface of a planar, sheet-like or web-like substrate, and for the purposes of the present invention it is not important, what method is used. In the schematic illustration of FIG. 2 the application of an adhesive would be included in the substrate feeder 201.

The applied patches of adhesive thus constitute the adhesion areas. In order to transfer the electrically conductive solid particles onto these areas the substrate is taken past a transfer roll 302, which in this embodiment of the invention is configured to have a slightly sticky surface and to rotate through a fluidized powderbed 303 of electrically conductive solid particles. These become temporarily attached to the surface of the transfer roll 302, and simultaneously acquire an electric charge of a specific polarity. A counterelectrode 304 of the opposite polarity is located behind the substrate that passes by, so that when the electrically charged conductive particles experience the created electric field, they tend to migrate towards the counterelectrode 304. Those of the electrically conductive particles that hit the adhesive stay there, while others return to the fluidized powderbed 303.

The use of an electric field is only an additional feature in this embodiment of the invention. If the dimensioning is right, it is possible to make the electrically conductive solid particles hop over from the transfer roll 302 to the adhesion areas by only relying on the adhesion properties of the sticky surface of the transfer roll on one hand and of the adhesion areas on the other hand. Particles that are temporarily attached to the slightly sticky surface of the transfer roll stick more strongly to an adhesion area if they come into touch with one, and are consequently ripped off the surface of the transfer roll, while particles that only meet the bare surface of the substrate 202 remain attached to the transfer roll. The surface of the transfer roll being "sticky" does not limit the way in which the adhesion between it and the electrically conductive solid particles is created; in particular the adhesion between the transfer roll surface and the electrically conductive solid particles is not limited to dispersive adhesion of the kind that adhesive chemical compounds create in sticky tapes. If the electrically conductive solid particles have magnetic properties, the adhesion can be created with magnetism. If the materials and their properties allow, also electrostatic adhesion can be considered.

The arrangement of the present invention may be a substantially integral aggregate or ensemble of features and elements altogether forming also a functional entity characterized herein. It may, for example, comprise a common housing for multiple elements and/or have all or at least most of the parts at least indirectly, if not directly, physically connected together. Anyhow, the apparatus, or 'arrangement', as meant to be understood in connection with the present invention, may alternatively comprise multiple physically separate but still functionally connecting elements, each serving a purpose of its own in providing the target substrate with properly positioned components.

Figure 4:
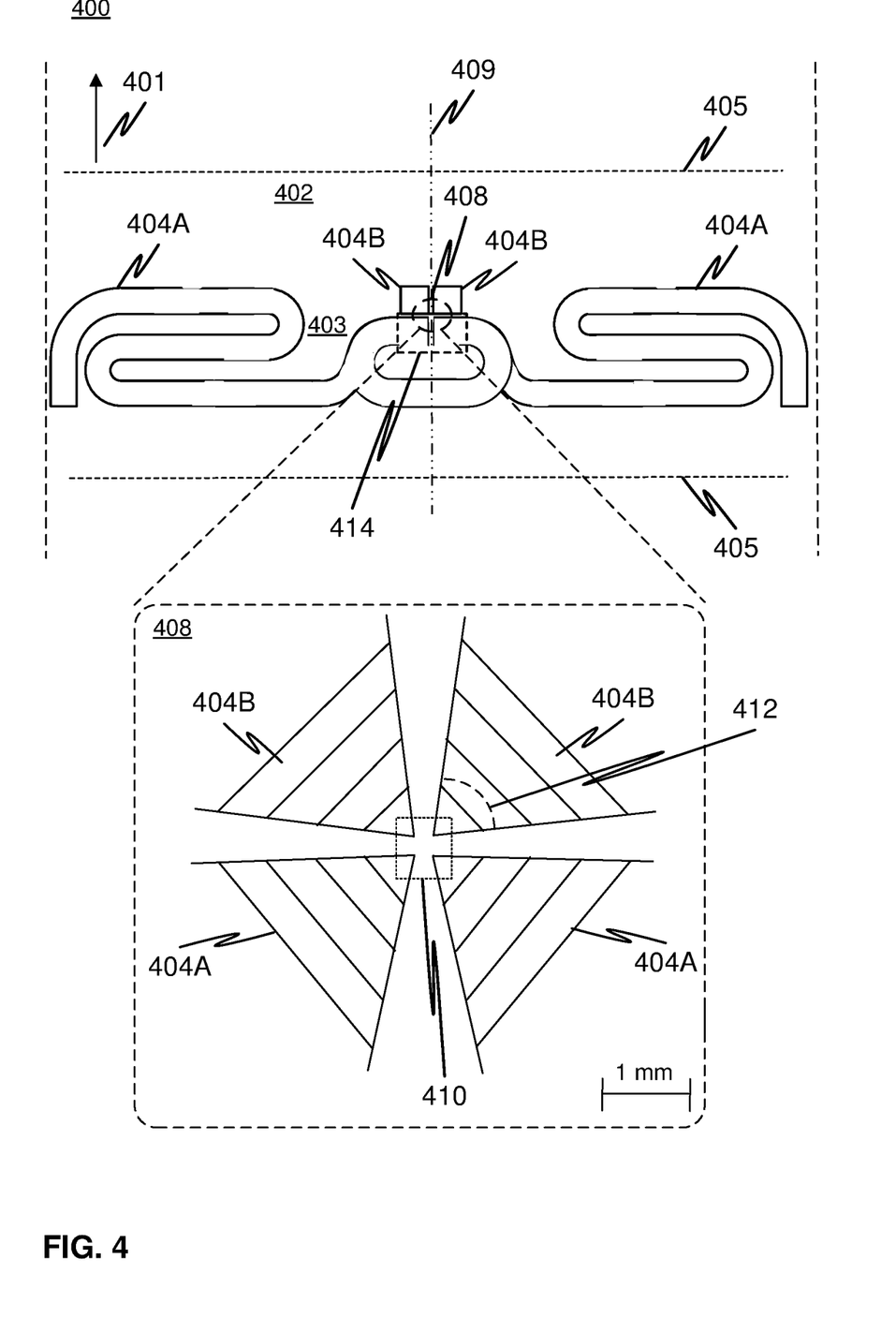
FIG. 4 illustrates one example of a conductive pattern provided on a substrate in accordance with an embodiment of the present invention.

FIG. 4 illustrates one example of a conductive pattern provided on a substrate in accordance with an embodiment of the present invention. A continuous substrate 402 may propagate in the direction of arrow 401 and accommodate multiple successive electrically conductive, optionally substantially identical, patterns, each pattern being aimed for use in a separate product piece, whereupon the substrate 402 may contain cut-off points, lines or at least structure-free areas 405 between the independent patterns so that the substrate 402 may be later conveniently cut or otherwise processed into pieces prior to or after the mounting of the electronic components such as chips thereon. Instead of continuous substrate films and e.g. related roll-to-roll processes, separate substrate pieces could be formed at an early stage of the process for more independent manufacturing of product pieces right from the beginning.

Each separate or to-be-separated substrate portion has been thus provided with a conductive pattern 403 using conductive particles that have been advantageously connected by heat and pressure to form a number of larger, continuous electrically conductive elements 404A, 404B on the substrate 402 (and e.g. adhesive thereon as contemplated hereinearlier). Together, these elements 404A, 404B form a conductive layer on the substrate 402 in the shape of the pattern 403.

The conductive structure defined by element 404A may functionally form at least part of an antenna or antenna structure of two or more antennae, for example. The element 404B may refer to a contact area or 'contact pad' for electronics such as electronic components. There may be multiple of such in the pattern 403. Indeed, in one embodiment the shown solution is used to form a wireless tag, such as RFID (radio frequency identification) tag where the pattern 403 defines at least two elements comprising an antenna structure 404A and a number of contact areas 404B for electrically and physically connecting an electronic component such as an RFID chip to the substrate, e.g. the antenna 404A thereon. An element may have several functionalities. For example, the element 404A may act as an antenna and also define a contact area for electronics.

The pattern 403 may be symmetrical as shown in the figure, for instance, and the elements 404A, 404B may have e.g. mirror-symmetric portions or counterparts relative to the axis of symmetry 409 that is in the shown example the longitudinal center axis of the substrate 402 parallel to propagation direction 401 thereof. Additionally or alternatively, the element 404A and the at least adjacent portion 414 of element 404B may be mutually symmetrical relative a common reference point, axis or plane, such as the transverse (horizontal) axis as is the case in the embodiment of FIG. 4, or the aforesaid axis 409 (not shown).

The area 408 where the elements 404A, 404B are closest to and almost contact each other has been magnified in the lower half of FIG. 4. The dimensions of the elements 404A, 404B may naturally considerably vary between the embodiments, but one potential, however merely exemplary, scale has been depicted on the right so it becomes very clear to a skilled person that the discussed, obtainable distances and dimensions may be rather small, in the order of magnitude of less than a millimetre, for example, e.g. one or few tenths thereof, or even less.

The area 408 may be later provided with an electronic component, such as a chip (IC, integrated circuit), depicted in the figure with a dotted rectangle 410. The component 410 may establish electrical contact to the elements 404A, 404B via the matching contact points of the component 410. As can be seen from the figure, the achieved shapes of elements 404A, 404B exhibit highly symmetrical, substantially straight-edged forms with still a small distance between them to prevent short circuiting that was present in the solution of FIG. 1 due to the lack of thermal (mass) optimization. Neither the adjacent portions of the same element 404A, 404B nor the portions of adjacent elements 404A, 404B accidentally contact each other but remain separate instead, which was one of the achieved objectives here.

The elements 404A, 404B or at least their portions may be said to be adjacent to each other from the standpoint of various embodiments of the present invention and related thermal mass optimization when their mutual distance is equal or less than a predefined threshold. The threshold may be determined case-specifically based on the used materials (e.g. their flow properties, temperature response or heat expansion characteristics, particle sizes, etc.), shapes, volumes, and manufacturing technology used (achievable resolution, etc.), but in some embodiments such as the illustrated case e.g. a distance of about one millimetre or few tenths of a millimetre (e.g. about 2, 3, 4, 5, 6 or 7 tenths), may be considered as a such threshold. Alternatively, instead of absolute definition the distance threshold may be defined relatively. For instance, adjacency may be considered when the distance of the analysed two elements is equal or less than about some predefined fraction (e.g. half, third, fourth, fifth, or tenth) of selected dimensions such as length or width of the elements optionally in the direction of the minimum mutual distance.

As mentioned hereinbefore, thermal masses of close elements such as elements 404B, 404A may be optimized such that the heat is distributed optimally, such as evenly, among them at least having regard to portions thereof that are adjacent to each other.

The thermal masses of adjacent elements 404A, 404B wherein one element 404A is surface area-wise considerably larger than the other element 404B may be designed substantially equal having regard to adjacent portions thereof. The masses do not have to be exactly the same, but similar enough to prevent short circuits etc. In these cases, the surface area size of the portion of the larger element 404A to be considered adjacent to and to be thus thermally optimized in the light of the smaller element 404B may be substantially matched with the surface area of the smaller element 404B, for example. This is useful approach particularly when the used materials in the elements 404A, 404B are substantially the same. In the shown case, portion 414 of element 404A could be thus considered as an adjacent portion to be thermally matched with the smaller element 404B, for instance. Yet, besides mere surface areas also the thicknesses of the associated material layers are preferably taken into account in the matching, or generally, in thermal optimization. Thus the actual volumes may be optimized in case the material thicknesses vary. It may often simplify the design and manufacturing process to utilize generally same materials and layer thicknesses in the neighbouring conductive elements 404A, 404B.

Still, the similarity of the shapes and dimensions may be often considered a benefit as accordingly, the thermal mass of the associated elements can be spatially more accurately equalized also locally. Spatially uneven heating of any structure could for its part cause undesired effects in terms of material flow, smearing, dripping, etc. Further, as depicted in the illustrated case, the adjacent portions of elements 404A, 404B may be symmetrically positioned having regard to an axis of symmetry in addition to using similar dimensions, shapes, areas and/or material thicknesses.

Being particularly visible in the magnification 408, FIG. 4 illustrates one more preferred design rule and property of the provided conductive elements 404A, 404B. Even if the elements 404A, 404B contain angular edges in the adjacent areas, as they clearly do at the centre portion underlying the potential chip 410, the associated angles 412 shall remain moderate so that during heating (or cooling) the edge areas of an element 404A, 404B substantially follow the general temperature of the connected remaining, area- and volume-wise, larger portions of the elements 404A, 404B, i.e. the edge areas do not overheat or cool down too rapidly when the heating process has been adjusted in the light of the overall area or average area.

Utilization of sharp-edged acute-angled edges in connection with rapidly expanding (widening)/convergent shapes, such as triangular edge area shapes, with particularly sharp angles (e.g. 50 deg, 45 deg, 30 deg or less) in the elements 404A, 404B shall be omitted and more gently angled (blunt) shapes used instead, such as oblique angles over about 50, 60, 65, or 70 degrees, or e.g. right or even larger angles. Still, acute angles may be in principle applicable in the element shapes 404A, 404B as shown in the figure but not with the extreme (lower end) figures.

The above contemplations regarding the angular edges and related acute angles may be particularly relevant e.g. in scenarios where the substrate accommodating the conductive particles for forming the conductive pattern/layer thereon and the heating and/or pressing equipment (e.g. the sections 205 and 206 in the FIG. 2) are in relative movement. When there are rapidly expanding/convergent shapes in the direction of movement, the equipment 205, 206 may subject heat and/or pressure on a small portion of the substrate and elements thereof at a time, i.e. uneven local thermal load, which may cause problems in terms of spreading, smearing, cracking, etc. Therefore, besides generally utilizing more gentle and blunt angles and shapes as explained above, also the alignment of the shapes may be optimized in view of different processing phases 205, 206. For example, the areas/volumes of more abrupt or rapid expansion/convergence may be located more transversely (i.e. the direction of rapid expansion/convergence may be located more transversely) to the general propagation direction of the substrate.

Finally, rounded or more obtuse shapes may be generally preferred over sharper options with more abrupt changes.

Figure 5:
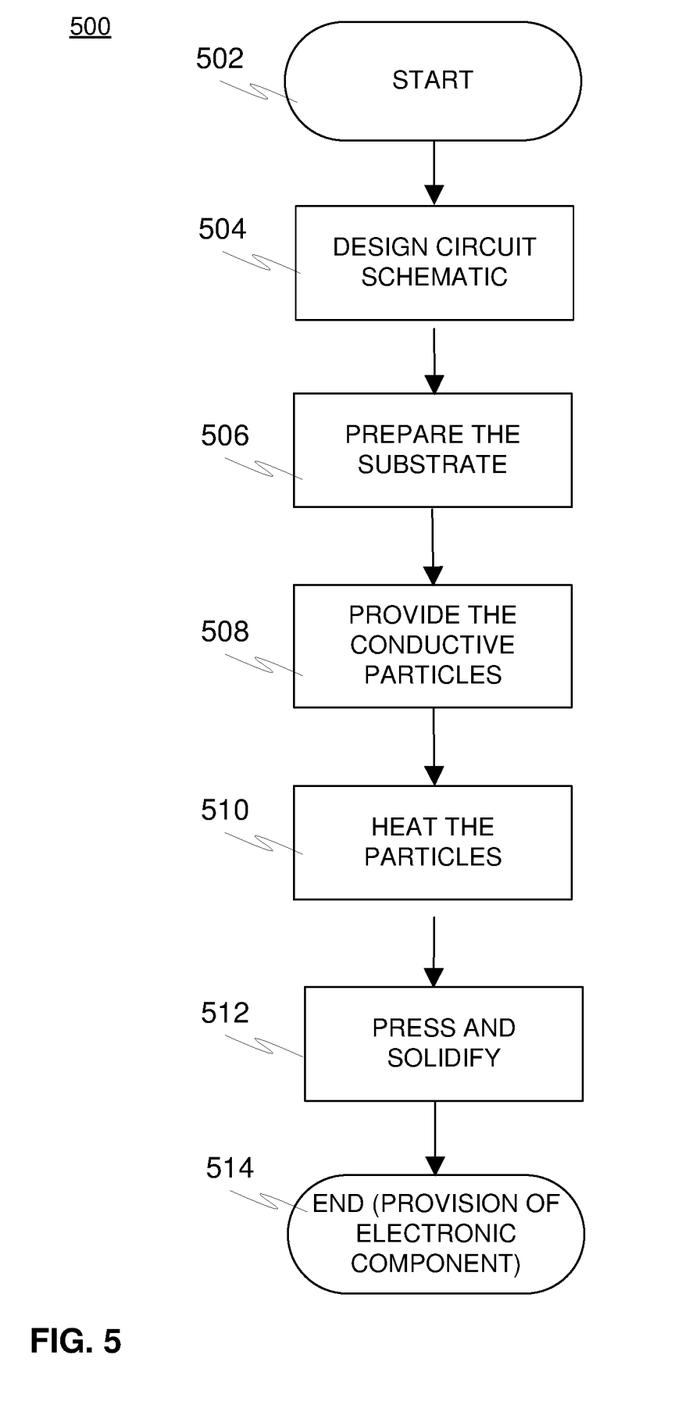
FIG. 5 is a flow diagram disclosing an embodiment of a method in accordance with the present invention.

FIG. 5 is a classic flow diagram disclosing an embodiment of a method in accordance with the present invention.

At start-up 502, necessary preparatory actions such as acquisition and configuration of process equipment and parameters may be executed. Components, substrates, conductive particles (e.g. powder, adhesive, carrier such as fluidic or gelatinous carrier containing the particles, etc.) may be obtained. The process parameters controlling the arrangement of one or more devices for executing the method shall be selected such that the utilized substrate, particles, components and other elements tolerate them.

At 504, the circuit schematic or layout containing a conductive pattern to be established from conductive particles connected together using heat and pressure is designed for the substrate. The design shall provide for optimized heat distribution among two or more adjacent, but not directly connected, elements of the pattern, such as the aforesaid (portion of the) antenna structure and contact area for a chip or other electronic component. Thermal masses of the elements shall be designed correspondingly. Preferably, the masses are configured to be substantially equal.

At 506, the substrate may be prepared, which may refer to placing e.g. adhesive thereon according to the desired pattern.

At 508, the conductive particles are provided onto the substrate as discussed hereinbefore. Adhesive and/or electrostatic transfer can be utilized.

At 510, the conductive particles are heated to a temperature higher than a characteristic melting point of the particles to establish a melt.

At 512, the melt is pressed against the substrate in a nip, the temperature of the contact portion of which being lower than the aforesaid characteristic melting point so as to solidify the particles into essentially electrically continuous layer within the contact area and within the conductive structure in accordance with the pattern.

At 514, method execution is ended. Optional post-treatment and processing tasks may take place. At least one electronic component such as an IC may be mounted on or generally attached to the substrate so that electrical connection with the established contact area(s) and preferred other structures such as antenna(e) is formed. The substrate may be over-molded by or otherwise supplemented with further material(s). The material(s) may have protective and/or aesthetical/decorative function, for example. Additional layers or structures may be laminated to the target substrate, or the substrate may itself be attached to a host structure or host device, optionally product packaging. Lamination may be temperature, pressure and/or adhesive-based among other options.

The obtained structure may establish at least part of a device such as a tag, wireless tag, RFID (Radio Frequency Identification) tag, RFID circuit, NFC (Near-Field Communication) tag, NFC circuit, antenna, antenna circuit, intelligent (electronic) label, sensor device, memory device, communications device, and/or a processing device.

A computer program or computer program product embodied e.g. in a non-transitory carrier and comprising a code means adapted, when run on a computer, to execute manufacturing device control over the desired method items in accordance with the present invention, may be provided. Carrier media such as an optical disc, a floppy disc, or a memory card, comprising the computer program may be considered among other feasible options. The program could be alternatively delivered as a signal over a communication network and a communication channel. The communication path may be wireless or wired, or contain legs of both types.

Consequently, a skilled person may on the basis of this disclosure and general knowledge apply the provided teachings to implement the scope of the present invention as defined by the appended claims in each particular real-life use scenario with necessary modifications, deletions, and additions, if any. For example, in some scenarios a preferred sintering method could be used to fuse the conductive particles into one or more continuous conductive areas of a desired pattern. Depending on the particular sintering technique used, the actual melting point of the conductive particles is not necessary reached, however the atomic diffusion between the particles is increased to fuse the particles due to the elevated temperature (representing some fraction of the actual melting temperature) and/or pressure applied during the procedure.

The invention claimed is:

1. A method for producing an electrically conductive pattern on substrate, comprising:
    designing a predefined pattern comprising a contact area for connecting to an electronic component and a conductive structure having a portion adjacent to the contact area, wherein said portion of the conductive structure and the contact area are separate from each other by a distance that is equal or less than a predefined threshold,
    determining a surface area and a thickness for the conductive structure and the contact, area that results in a substantially equal thermal mass based upon the predefined pattern,
    depositing electrically conductive solid particles onto an area of the substrate according to the predefined patterned at the determined surface area and thickness,
    heating the conductive particles to a temperature higher than a characteristic melting point of the particles to establish a melt, and
    pressing the melt against the substrate in a nip, the temperature of the contact portion of which being lower than the aforesaid characteristic melting point so as to solidify the particles into essentially electrically continuous layer within the contact area and within the conductive structure in accordance with the pattern while minimizing flow of the melt into areas between the contact area and the conductive structure.

2. The method of claim 1, wherein configuring the thermal masses substantially equal incorporates providing same conductive particles in substantially similar volumes for the contact area and the conductive structure.

3. The method of claim 1, wherein the shape and dimensions of the contact area and the at least portion of the conductive structure are symmetrical.

4. The method of claim 1, wherein the pattern is provided to exhibit at least local symmetry relative to a reference axis or reference plane.

5. The method of claim 1, wherein the contact area and the at least adjacent portion of the conductive structure are provided to exhibit angular edge areas with expansion or convergence direction aligned substantially transversely to the processing direction of the substrate during heating or pressing.

6. The method of claim 1, wherein the contact area and the at least adjacent portion of the conductive structure exclusively contain angular edges with angles over about 50 degrees.

7. The method of claim 1, comprising disposing an electronic component on the pattern so that it electrically connects to at least said contact area.

8. The method of claim 1, wherein the contact area and the conductive structure are positioned at a distance less than about one millimeter.

9. The method of claim 1, comprising provision of adhesive agent onto the substrate to attach the conductive particles thereto.

10. The method of claim 1, wherein electrical field is applied to facilitate transferring or attaching the conductive particles onto the substrate.

11. The method of claim 1, wherein the pattern is provided to exhibit at least local symmetry relative to a reference axis or reference plane that is parallel or perpendicular to the processing direction of the substrate during the heating or pressing actions.

12. The method of claim 1, comprising disposing an electronic component on the pattern so that it electrically connects to at least said contact area and the conductive structure.

13. The method of claim 1, comprising provision of adhesive agent onto the substrate to attach the conductive particles thereto, according to the pattern.

* * * * *